United States Patent
Belady et al.

(10) Patent No.: US 7,096,926 B2
(45) Date of Patent: Aug. 29, 2006

(54) THERMAL POUCH INTERFACE

(75) Inventors: Christian L Belady, McKinney, TX (US); Eric C. Peterson, McKinney, TX (US); Brent A Boudreaux, Highland Village, TX (US); Shaun L. Harris, McKinney, TX (US); Roy M. Zeighami, McKinney, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 9 days.

(21) Appl. No.: 10/831,059

(22) Filed: Apr. 22, 2004

(65) Prior Publication Data

US 2004/0194915 A1 Oct. 7, 2004

Related U.S. Application Data

(62) Division of application No. 10/104,730, filed on Mar. 21, 2002, now abandoned.

(51) Int. Cl.
 *F28F 7/00* (2006.01)
(52) U.S. Cl. .................................... 165/46; 165/104.21
(58) Field of Classification Search .................. 165/10, 165/46, 104.26, 104.21, 104.33, 185
 See application file for complete search history.

(56) References Cited

U.S. PATENT DOCUMENTS

| | | | |
|---|---|---|---|
| 4,108,239 A | | 8/1978 | Fries |
| 4,211,208 A | * | 7/1980 | Lindner ........................ 165/10 |
| 4,601,331 A | | 7/1986 | Kessler |
| 4,756,311 A | * | 7/1988 | Francis, Jr. .................. 165/46 |
| 5,205,348 A | | 4/1993 | Tousignant |
| 5,245,508 A | | 9/1993 | Mizzi |
| 5,603,375 A | | 2/1997 | Salt |
| 5,642,776 A | | 7/1997 | Meyer |

FOREIGN PATENT DOCUMENTS

EP          0059581          9/1982

* cited by examiner

*Primary Examiner*—Ljiljana Ciric
(74) *Attorney, Agent, or Firm*—Leslie P. Gelman

(57) ABSTRACT

A sealed pouch constructed of thermally conductive flexible material containing a low melting point, thermally conductive material is placed between two components that require thermal continuity. This assembly is then loaded in compression and heated to the melting point of the low melting point, thermally conductive material, which then melts within the sealed pouch, and conforms to the shape of the two components. The sealed pouch also may contain a springy material made of a metal, or a solder compatible plastic or organic to help maintain shape of the pouch in some applications.

10 Claims, 7 Drawing Sheets

THERMAL POUCH INTERFACE

This is a divisional of application Ser. No. 10/104,730, filed Mar. 21, 2002 also entitled now abandoned, "Thermal Pouch Interface," which is hereby incorporated by reference herein.

FIELD OF THE INVENTION

The present invention relates generally to the field of heat transfer and more specifically to the field of heat transfer between irregularly shaped objects.

BACKGROUND OF THE INVENTION

Modem electronics have benefited from the ability to fabricate devices on a smaller and smaller scale. As the ability to shrink devices has improved, so has their performance. Unfortunately, this improvement in performance is accompanied by an increase in power as well as power density in devices. In order to maintain the reliability of these devices, the industry must find new methods to remove this heat efficiently.

By definition, heat sinking means that one attaches a cooling device to a heat-generating component and thereby removes the heat to some cooling medium, such as air or water. Unfortunately, one of the major problems in joining two devices to transfer heat is that a thermal interface is created at the junction. This thermal interface is characterized by a thermal contact impedance. Thermal contact impedance is a function of contact pressure and the absence or presence of material filling small gaps or surface variations in the interface.

The heat-sinking problem is particularly difficult in devices such as multi-chip modules ("MCMs") where multiple components need to have topside cooling into a single cold plate or heat sink. The various components within the multi-chip module may not be of equal thickness, creating a non-coplanar surface that often must be contacted to a single planar surface of the cold plate or heat sink. Engineers have developed a variety of approaches to solving the non-coplanar surface problem, such as, gap fillers comprising thick thermal pads capable of absorbing 10 to 20 mils of stack up differences. However, the thickness and composition of these thermal pads often results in a relatively high thermal resistance making them suitable only for low power devices. Others have used pistons with springs attached to them attached to a plurality of small cold plates or heat sinks to account for the irregularity of the stack up. However, this can become an expensive solution to the problem. Still others have used an array of small cold plates connected together by flexible tubing allowing some flexibility between the plates to account for the variations in height of the components. However, once again, this solution may become too expensive for many products.

Other solutions include the use of thermal grease or phase change materials, such as paraffin, to fill in small gaps, such as the microscopic roughness between two surfaces. However, thermal grease and phase change materials are unable to fill larger gaps such as those present in multi-chip modules.

SUMMARY OF THE INVENTION

A sealed pouch constructed of thermally conductive flexible material containing a low melting point, thermally conductive material is placed between two components that require thermal continuity. This assembly is then loaded in compression and heated to the melting point of the low melting point, thermally conductive material, which then melts within the sealed pouch, and conforms to the shape of the two components. The sealed pouch also may contain a springy material made of a metal, or a solder compatible plastic or organic to help maintain shape of the pouch in some applications.

Other aspects and advantages of the present invention will become apparent from the following detailed description, taken in conjunction with the accompanying drawings, illustrating by way of example the principles of the invention.

DETAILED DESCRIPTION

Figure 1:
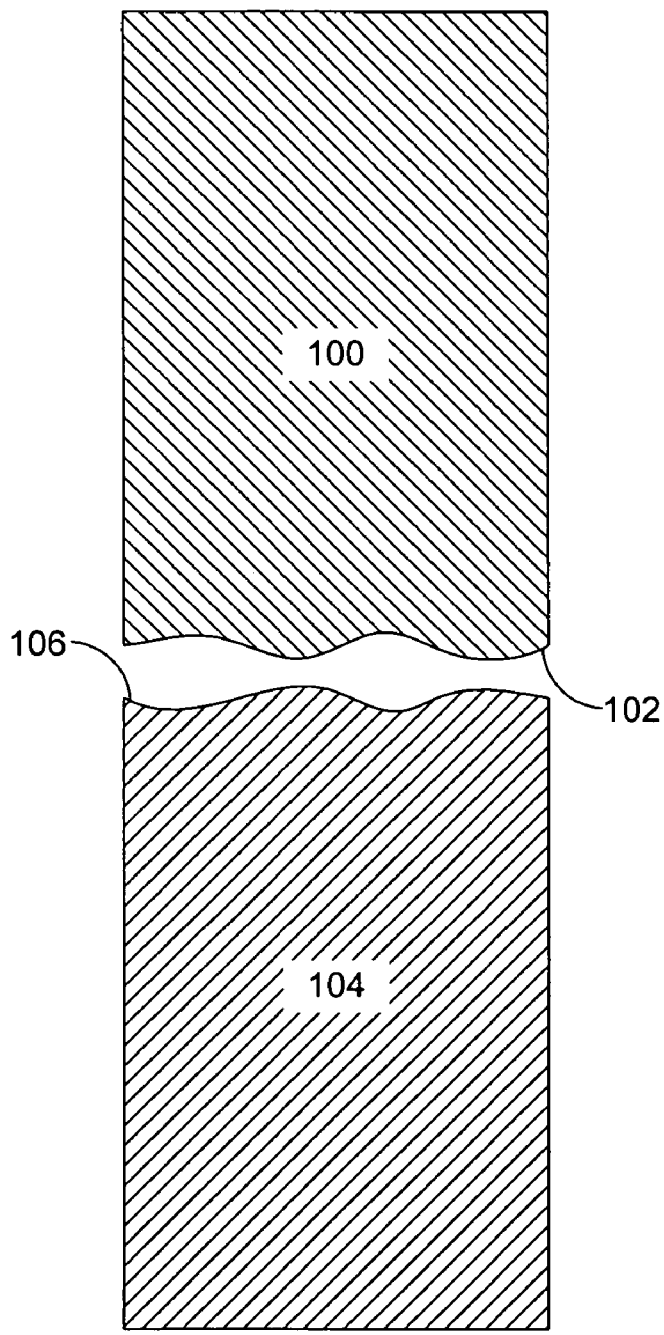
FIG. 1 is a cross-section of the interface between two surfaces.

FIG. 1 is a cross-section of the interface between two surfaces. In this greatly magnified view of the interface between two surfaces, a first object 100 having a first surface 102 is brought into contact with a second object 104 having a second surface 106. Neither surface is perfectly flat resulting in an imperfect mating of the two surfaces. This imperfect interface contributes to a thermal contact resistance at the interface between the two objects.

Figure 2:
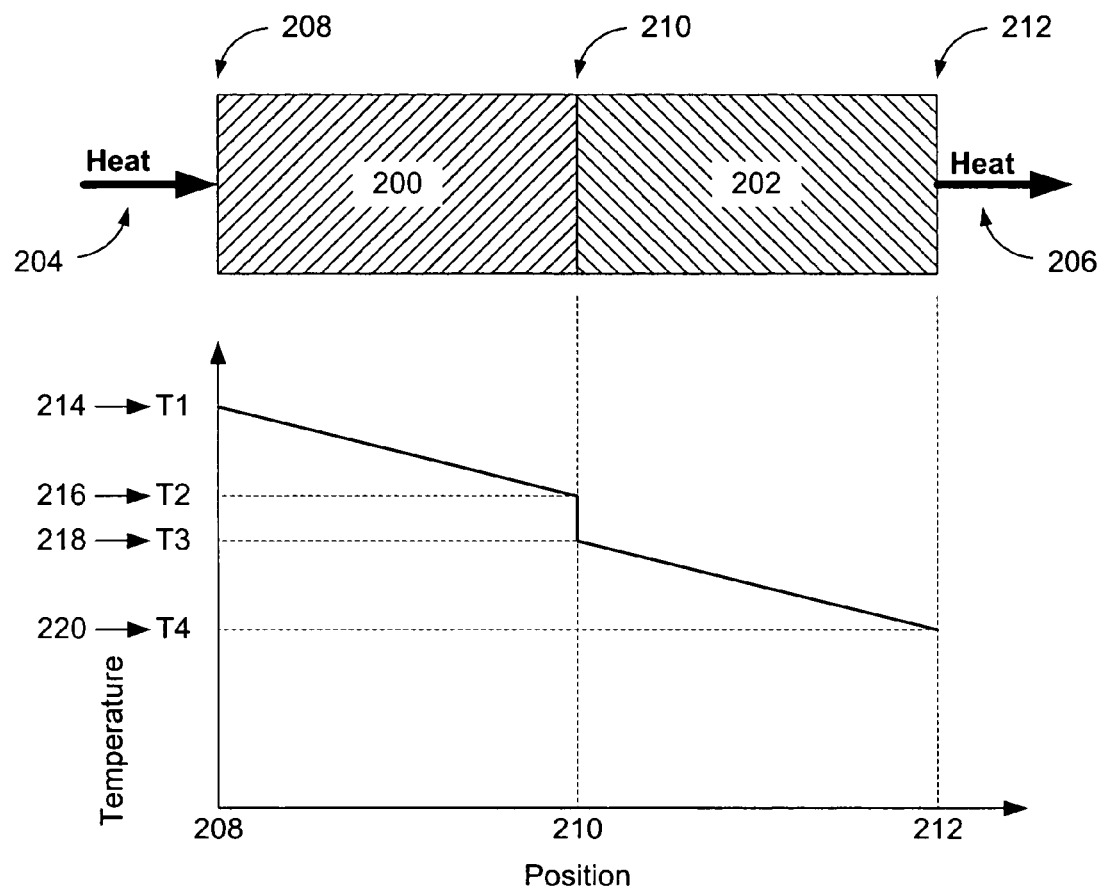
FIG. 2 is a graph of temperature versus position through an interface between two thermal conductors.

FIG. 2 is a graph of temperature versus position through an interface between two thermal conductors. In this view of two thermally conductive objects joined together, a graph of temperature versus position is shown below a cross-sectional view of the two objects including the thermal interface 210 between them. A first object 200 is joined with a second object 202 producing a thermal interface 210 at the point where the objects join. As shown in FIG. 1, this interface between the two objects is not a perfect joint and contributes to a thermal contact resistance at the thermal interface 210. When thermal energy as heat 204 enters the first object 200, passes through it to the second object 202, before exiting the second object as heat 206, the thermal energy must pass through the thermal interface 210 between the two objects. The thermal energy enters the first object 200 at a position 208 and a temperature T1 214, and decreases to a temperature T2 216 as it passes through the first object 200. At the thermal interface 210 between the two objects the thermal energy must overcome a thermal contact resistance and the temperature decreases to a temperature T3 218 as it enters the second object 202. The temperature decreases to a temperature T4 220 as it passes through the second object 202 where it is radiated as heat 206 at a position 212.

Figure 3A:
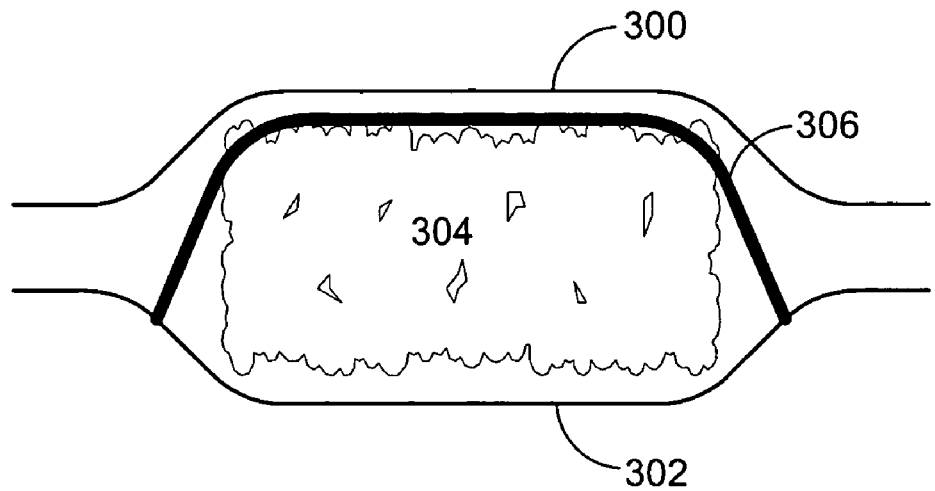
FIG. 3A is a cross-section of an example embodiment of a thermal pouch interface according to the present invention during construction.
Figure 6A:
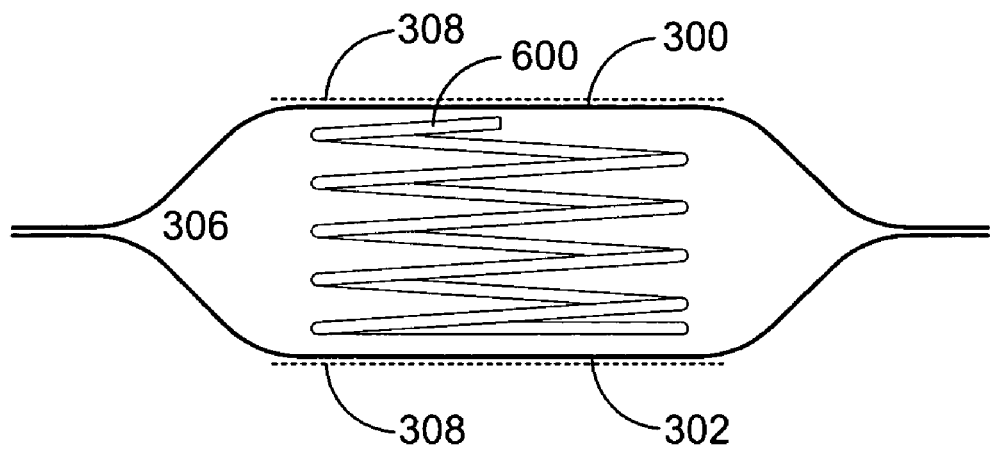
FIG. 6A is a cross-section of an example embodiment of a thermal pouch interface according to the present invention including a single spring.
Figure 6B:
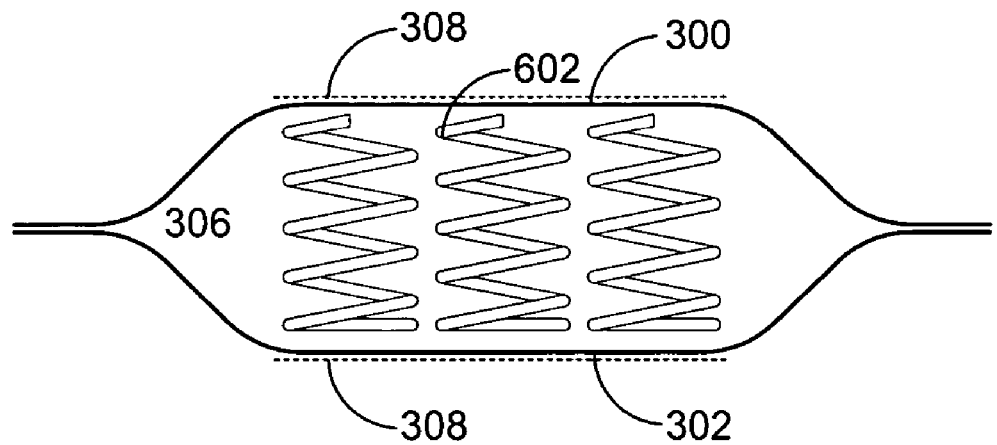
FIG. 6B is a cross-section of an example embodiment of a thermal pouch interface according to the present invention including a plurality of springs.

FIG. 3A is a cross-section of an example embodiment of a thermal pouch interface according to the present invention during construction. A top sheet 300 and a bottom sheet 302 of a flexible, thermally conductive material are constructed to enclose a quantity of low melting point, thermally conductive material 306, such as low melting point solder or liquid metal. As discussed in more detail below, the low melting point, thermally conductive material 306 will be in liquid form as the thermal pouch is compressed. Therefore, the melting point of the low melting point, thermally conductive material 306 must be lower than the melting point of the materials used in the devices that are to be thermally joined by the thermal pouch. Those skilled in the art will recognize that many different flexible, thermally conductive materials may be used to create the top sheet and bottom sheet within the scope of the present invention. Some example materials include, copper, aluminum, and mylar. Those skilled in the art will also recognize that there are many different methods of creating a top sheet and a bottom sheet from flexible, thermally conductive material within the scope of the present invention. Some example methods include, creating two separate sheets of material, folding a single sheet of material to form a top sheet and a bottom sheet and sealing three edges, or forming a cylinder of the material to create a top sheet and a bottom sheet. Other embodiments of the present invention may use a thermally conductive liquid, such as mercury, as the low melting point, thermally conductive material 306. While mercury is toxic, if kept sealed within a thermal pouch, it may pose little risk. Optionally, a springy material 304 may be included in the construction if needed to help maintain contact pressure between the thermal pouch and the two components it will be sandwiched between. The springy material 304 may comprise a metal or solder compatible plastic or organic that has sufficient springy properties to resist deformation to some extent. In a preferred embodiment of the present invention, the low melting point, thermally conductive material 306, once melted, will fill the interstices within the springy material 304 but not penetrate the individual wires or fibers of the springy material 304. Other embodiments of the present invention may use one or more springs as the springy material 304 as shown in FIGS. 6A and 6B. Still other embodiments may use metal wool as the springy material 304. Steel wool and copper wool are two examples of metal wool. Other embodiments of the present invention may not require any springy material 304 and be constructed containing only a low melting point, thermally conductive material 306.

Figure 3B:
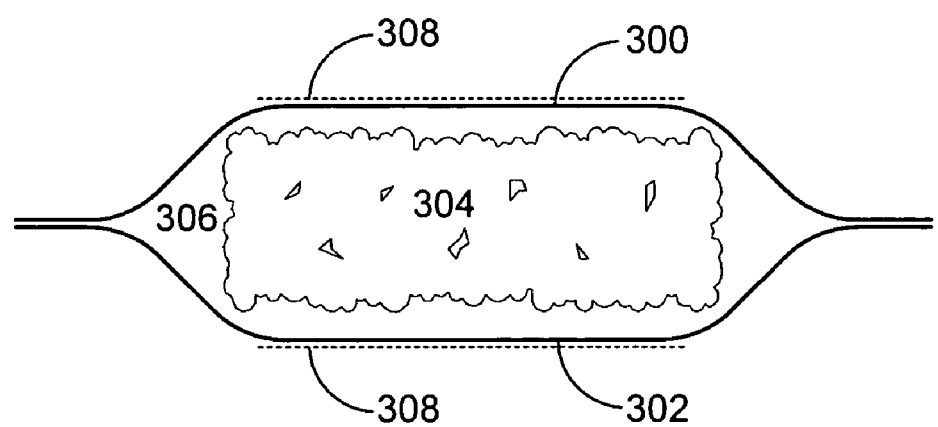
FIG. 3B is a cross-section of the example embodiment of a thermal pouch interface from FIG. 3A after construction.

FIG. 3B is a cross-section of the example embodiment of a thermal pouch interface from FIG. 3A after construction. After the top sheet 300 and bottom sheet 302 have been sealed together, a thermal pouch filled with a low melting point, thermally conductive material 306, and optionally a quantity of springy material 304 is created. In a preferred embodiment of the present invention, the final thermal pouch will be completely filled with the low melting point, thermally conductive material 306 and springy material 304 with all air (or other gases) expelled from the pouch during construction. This eliminates any air pockets within the thermal pouch that may cause a reduction in thermal conductivity of the thermal pouch. Thus, once the thermal pouch is sealed, and the temperature raised above the melting point of the low melting point, thermally conductive material 306, the thermal pouch will be flexible enough to conform to non-planar surfaces of the devices it is used to thermally join. Other embodiments of the present invention may include a coating 308 such as thermal grease, phase change material, or solder on the outer surfaces of the thermal pouch to fill in the very small irregularities in the interface between the thermal pouch and any components it contacts. Note that some embodiments of the present invention may use a different coating 308 on the top surface of the thermal pouch, than the coating 308 on the bottom surface of the thermal pouch. Also, some embodiments of the present invention may use a coating 308 on only one surface of the thermal pouch, or not use any coating 308 at all.

Figure 4:
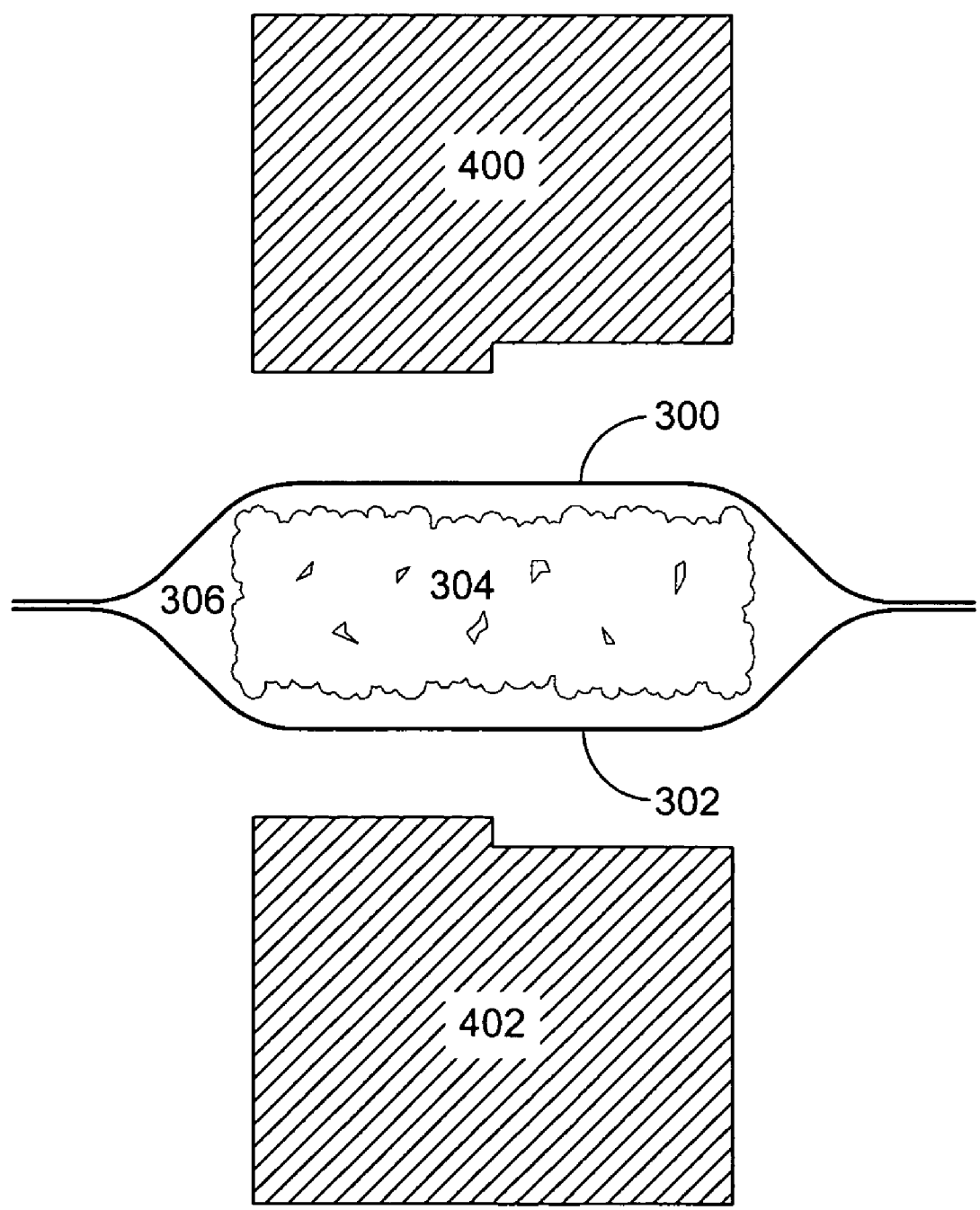
FIG. 4 is a cross-section of an example embodiment of a thermal pouch interface according to the present invention prior to use between two components.

FIG. 4 is a cross-section of an example embodiment of a thermal pouch interface according to the present invention prior to use between two components. A completed thermal pouch is placed between a top component 400 and a bottom component 402 having non-coplanar surfaces. The thermal pouch comprises a top sheet 300, a bottom sheet 302, a quantity of low melting point, thermally conductive material 306 and a quantity of springy material 304, as shown in FIGS. 3A and 3B. In an example use of the present invention, the bottom component 402 may be a multi-chip module and the top component 400 may be a heat sink. One embodiment of the present invention may use a single thermal pouch interface between the multi-chip module and the heat sink, while another embodiment may use a plurality of small thermal pouch interfaces between the individual components on the multi-chip module and the heat sink.

Figure 5:
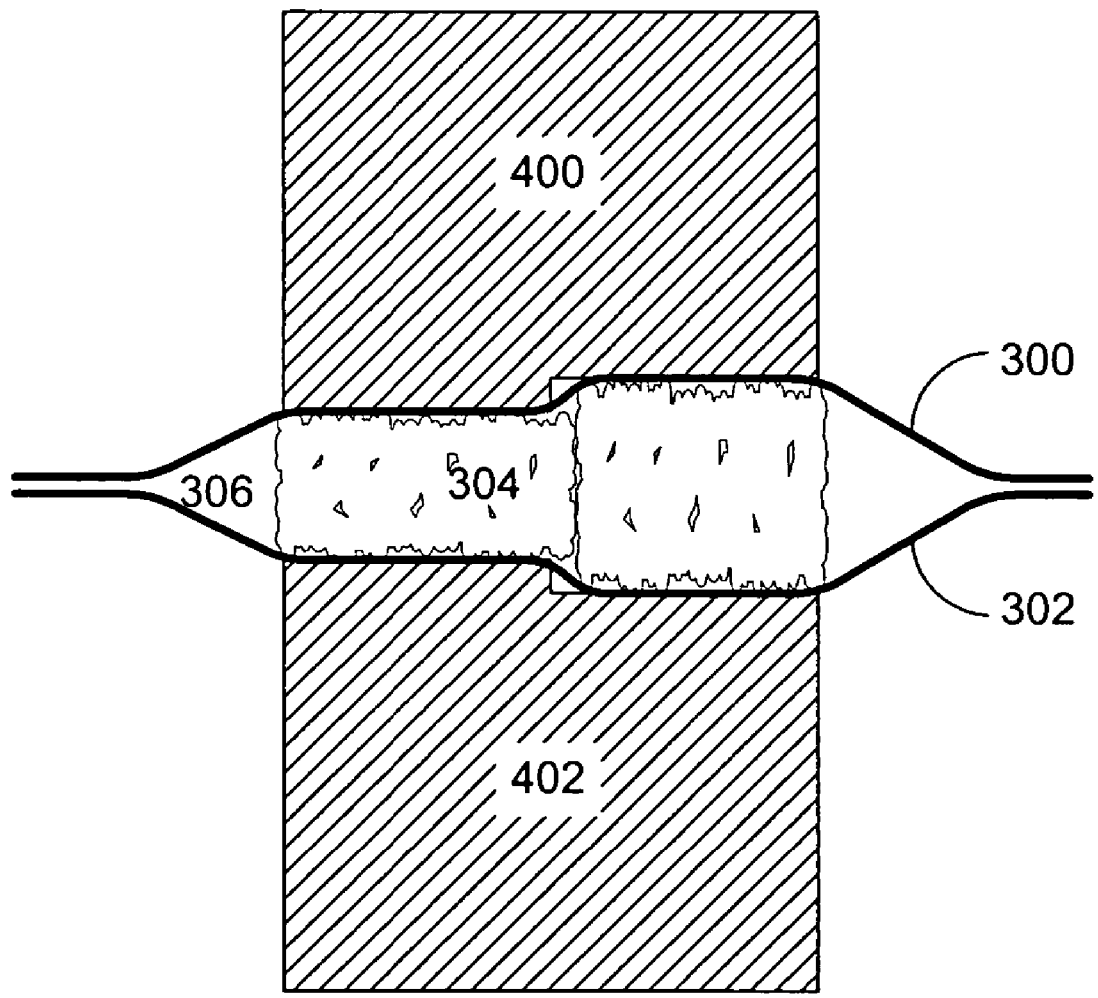
FIG. 5 is a cross-section of the example embodiment of a thermal pouch interface from FIG. 4 during use between two components.

FIG. 5 is a cross-section of the example embodiment of a thermal pouch interface from FIG. 4 during use between two components. The temperature of the thermal pouch is raised above the melting point of the low melting point, thermally conductive material 306, yet below the melting point of materials within the two components 400 and 402. The two components 400 and 402 from FIG. 4 are now moved to their final positions, compressing the thermal pouch between them. Since the low melting point, thermally conductive material 306 is in a liquid state during this compression of the thermal pouch, the pouch flexes to conform to any non-planarity in the surfaces of the two components 400 and 402. The thermal pouch comprises a top sheet 300, a bottom sheet 302, a quantity of low melting point, thermally conductive material 306 and a quantity of springy material 304, as shown in FIGS. 3A and 3B. Note that the thermal pouch has deformed to match the non-coplanar shapes of the two components 400 and 402 creating a low thermal resistance thermal contact between the two components 400 and 402.

FIG. 6A is a cross-section of an example embodiment of a thermal pouch interface according to the present invention including a single spring. FIG. 6A shows an example embodiment of the present invention similar to that of FIG. 3B where the springy material 304 comprises a single spring 600.

FIG. 6B is a cross-section of an example embodiment of a thermal pouch interface according to the present invention including a plurality of springs. FIG. 6B shows an example embodiment of the present invention similar to that of FIG. 3B where the springy material 304 comprises a plurality of springs 602.

Figure 7:
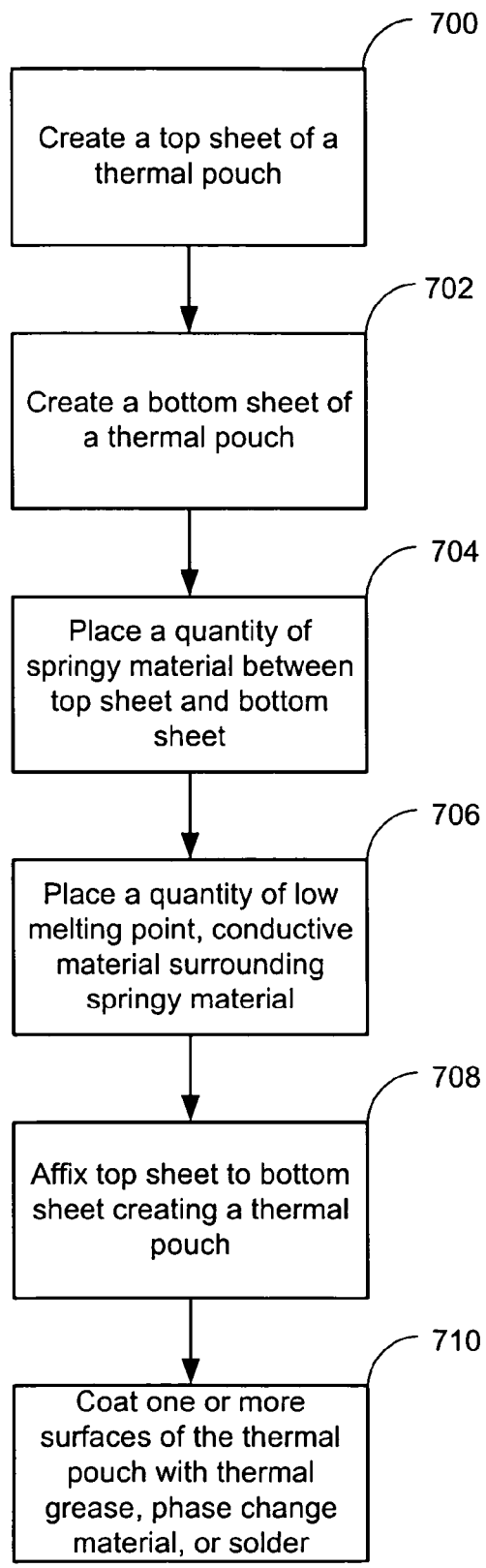
FIG. 7 is a flow chart of an example method for the construction of a thermal pouch according to the present invention.

FIG. 7 is a flow chart of an example method for the construction of a thermal pouch according to the present invention. In a step 700 a top sheet 300 of a thermal pouch is created. In a step 702 a bottom sheet 302 of a thermal pouch is created. In an optional step 704 a quantity of springy material 304 is placed between the top sheet 300 and the bottom sheet 302. In a step 706 a quantity of low melting point, thermally conductive material is placed surrounding the springy material 304. In a step 708 the top sheet 300 and bottom sheet 302 are affixed to each other forming a thermal pouch. In an optional step 710 one or more surfaces of the thermal pouch are coated with thermal grease, phase change material, or solder 308.

The foregoing description of the present invention has been presented for purposes of illustration and description. It is not intended to be exhaustive or to limit the invention to the precise form disclosed, and other modifications and variations may be possible in light of the above teachings. The embodiments were chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A thermal pouch comprising:
   a quantity of low melting point, thermally conductive material;
   a top sheet of flexible, thermally conductive material;
   a bottom sheet of flexible, thermally conductive material, sealed with said top sheet forming a thermal pouch surrounding said quantity of low melting point, thermally conductive material; and
   at least two springs within said top sheet and bottom sheet substantially surrounded by said quantity of low melting point, thermally conductive material after melting of said quantity of low melting point, thermally conductive material, wherein said low melting point, thermally conductive material comprises solder.

2. A thermal pouch comprising:
   a quantity of low melting point, thermally conductive material;
   a top sheet of flexible, thermally conductive material;
   a bottom sheet of flexible thermally conductive material, sealed with said top sheet forming a thermal pouch surrounding said quantity of low melting point, thermally conductive material; and
   at least two springs within said top sheet and bottom sheet substantially surrounded by said quantity of low melting point, thermally conductive material after melting of said quantity of low melting point, thermally conductive material, wherein said top sheet and said bottom sheet are mylar.

3. A thermal pouch comprising:
   a quantity of low melting point, thermally conductive material;
   a top sheet of flexible, thermally conductive material;
   a bottom sheet of flexible, thermally conductive material, sealed with said top sheet forming a thermal pouch surrounding said quantity of low melting point, thermally conductive material; and
   at least two springs within said top sheet and bottom sheet substantially surrounded by said quantity of low melting point, thermally conductive material after melting of said quantity of low melting point, thermally conductive material, wherein said top sheet and said bottom sheet are soldered to each other forming said thermal pouch.

4. A thermal pouch comprising:
   a quantity of low melting point, thermally conductive material;
   a top sheet of flexible, thermally conductive material;
   a bottom sheet of flexible, thermally conductive material, sealed with said top sheet forming a thermal pouch surrounding said quantity of low melting point, thermally conductive material; and
   at least two springs within said top sheet and bottom sheet substantially surrounded by said quantity of low melting point, thermally conductive material after melting of said quantity of low melting point, thermally conductive material, wherein said top sheet and said bottom sheet are glued to each other forming said thermal pouch.

5. A thermal pouch comprising:
   a quantity of low melting point, thermally conductive material;
   a top sheet of flexible, thermally conductive material;
   a bottom sheet of flexible, thermally conductive material, sealed with said top sheet forming a thermal pouch surrounding said quantity of low melting point, thermally conductive material; and
   at least two springs within said top sheet and bottom sheet substantially surrounded by said quantity of low melting point, thermally conductive material after melting of said quantity of low melting point, thermally conductive material, wherein said top sheet and said bottom sheet are welded to each other forming said thermal pouch.

6. A thermal pouch comprising:
   a quantity of low melting point, thermally conductive material;
   a top sheet of flexible, thermally conductive material;
   a bottom sheet of flexible, thermally conductive material, sealed with said top sheet forming a thermal pouch surrounding said quantity of low melting point, thermally conductive material; and
   at least two springs within said top sheet and bottom sheet substantially surrounded by said quantity of low melting point, thermally conductive material after melting of said quantity of low melting point, thermally conductive material, wherein an outer surface of said thermal pouch is coated with thermal grease.

7. A method for constructing a thermal pouch, comprising the steps of:
   a) creating a top sheet of flexible, thermally conductive material;
   b) creating a bottom sheet of flexible, thermally conductive material;
   c) placing a quantity of low melting point, thermally conductive material between said top sheet and said bottom sheet;
   d) affixing said top sheet to said bottom sheet, forming a thermal pouch; and
   e) placing at least two springs between said top sheet and said bottom sheet, wherein said low melting point, thermally conductive material is solder.

8. A method for constructing a thermal pouch, comprising the steps of:
   a) creating a top sheet of flexible, thermally conductive material;
   b) creating a bottom sheet of flexible, thermally conductive material;
   c) placing a quantity of low melting point, thermally conductive material between said top sheet and said bottom sheet;

d) affixing said top sheet to said bottom sheet, forming a thermal pouch; and e) placing at least two springs between said top sheet and said bottom sheet, wherein said flexible, thermally conductive material is mylar.

9. A method for constructing a thermal pouch, comprising the steps of:

a) creating a top sheet of flexible, thermally conductive material;

b) creating a bottom sheet of flexible, thermally conductive material;

c) placing a quantity of low melting point, thermally conductive material between said top sheet and said bottom sheet;

d) affixing said top sheet to said bottom sheet, forming a thermal pouch;

e) placing at least two springs between said top sheet and said bottom sheet; and f) coating an outer surface of said thermal pouch with thermal grease.

10. A method for constructing a thermal pouch, comprising the steps of:

a) creating a top sheet of flexible, thermally conductive material;

b) creating a bottom sheet of flexible, thermally conductive material;

c) placing a quantity of low melting point, thermally conductive material between said top sheet and said bottom sheet;

d) affixing said top sheet to said bottom shee, forming a thermal pouch;

e) placing at least two springs between said top sheet and said bottom sheet;

f) heating said thermal pouch to a temperature above a melting point of said low melting point, thermally conductive material; and g) compressing said thermal pouch between at least two components while said low melting point, thermally conductive material is a liquid.

* * * * *

UNITED STATES PATENT AND TRADEMARK OFFICE
CERTIFICATE OF CORRECTION

PATENT NO. : 7,096,926 B2
APPLICATION NO. : 10/831059
DATED : August 29, 2006
INVENTOR(S) : Christian L Belady et al.

It is certified that error appears in the above-identified patent and that said Letters Patent is hereby corrected as shown below:

On the title page, item (74), in "Attorney, Agent, or Firm", in column 2, line 1, delete "Gelman" and insert -- Gehman --, therefor.

In column 1, line 16, delete "Modem" and insert -- Modern --, therefor.

In column 5, line 43, in Claim 2, delete "flexible" and insert -- flexible, --, therefor.

In column 8, line 10, in Claim 10, after "bottom" delete "shee" and insert -- sheet --, therefor.

Signed and Sealed this

Seventeenth Day of February, 2009

JOHN DOLL
*Acting Director of the United States Patent and Trademark Office*